United States Patent [19]

Kothandaraman et al.

[11] Patent Number: 6,014,039
[45] Date of Patent: Jan. 11, 2000

[54] CMOS HIGH VOLTAGE DRIVE OUTPUT BUFFER

[75] Inventors: Makeshwar Kothandaraman; Bernard Lee Morris, both of Emmaus; Bijit Thakorbhai Patel, Breinigsville; Wayne E. Werner, Coopersburg, all of Pa.

[73] Assignee: Lucent Technologies Inc., Murray Hill, N.J.

[21] Appl. No.: 09/067,936

[22] Filed: Apr. 28, 1998

[51] Int. Cl.[7] ............... H03K 19/0948; H03K 19/0185
[52] U.S. Cl. .................................................. 326/83
[58] Field of Search ........................... 326/68, 63, 70, 326/71, 80, 81, 83, 86

[56] References Cited

U.S. PATENT DOCUMENTS 5,414,314  5/1995  Thurber, Jr. .
5,418,476  5/1995  Strauss ........................ 326/81
5,684,415  11/1997  McManus .................... 326/81
5,736,869  4/1998  Wei ............................. 326/81
5,808,480  9/1998  Morris ......................... 326/81

FOREIGN PATENT DOCUMENTS

WO 94/18755  8/1994  WIPO .
WO 94/29963  12/1994  WIPO .

*Primary Examiner*—Michael Tokar
*Assistant Examiner*—Don Phu Le

[57] ABSTRACT

A CMOS high voltage drive output buffer that protects the drive stage from seeing relatively high voltages (e.g., 5 V) during "hot pluggable" conditions (that is, when the reference voltage VDD is not present). A transmission gate and clamping transistors are disposed around the output devices to provide the requisite protection. A backgate bias generator for use with P-channel devices is also disclosed that is capable of withstanding "hot pluggable" conditions.

6 Claims, 4 Drawing Sheets

CMOS HIGH VOLTAGE DRIVE OUTPUT BUFFER

BACKGROUND OF THE INVENTION

1. Technical Field

The present invention relates to a CMOS high voltage drive output buffer protection circuit and, more particularly, to a CMOS high voltage drive output buffer protection circuit formed in low voltage CMOS technology (e.g., 3.3 V) that is tolerant of high input voltages (e.g., 5 V).

2. Description of the Prior Art

In many areas of CMOS circuit design there are arrangements that include sections that run between 0–5 V and other sections that use a voltage supply range of only 0–3.3 V. There is often a need to provide a "buffer" circuit between these sections. Thus, there is a need to supply a circuit in standard low voltage CMOS technology (e.g., 3.3 V) that can drive a relative high voltage (e.g., 5 V) on its output. Additionally, many system configurations require a circuit that is "hot pluggable", meaning that the circuit will not draw any current from a bus that is at a high voltage, even when the circuit is not powered (i.e., when VDD is not present). Further, the circuit should be designed so that it is not "harmed" when exposed to relatively high voltages. In particular, if the gate oxide of a MOS transistor is subjected to too high a voltage, it will break down, causing gate-to-drain and/or gate-to-source shorts. Likewise, the drain-to-source junction of a MOS transistor will be degraded by hot carriers if it is subjected to too great a voltage. Thus, an MOS circuit that is subjected to voltages higher than the technology must be designed to work in such a way that the individual transistors in the circuit never see these higher voltages across their gate oxides or their source-to-drain junctions.

One problem with a low voltage technology CMOS buffer interfacing with a relatively high voltage is that the source of a P-channel output transistor is usually connected to the low voltage power supply VDD. If a voltage greater than VDD is applied to the drain of this device (where the drain is usually connected to the PAD of the buffer), it will forward bias the parasitic diode inherent in the P-channel device, since the N-tub backgate of the P-channel transistors is usually connected to VDD.

An exemplary prior art output buffer 10 capable of driving a relatively high voltage (5 V) in a low voltage technology (e.g., 3 V) is illustrated in FIG. 1. In particular, buffer circuit 10 is capable of driving 5 V without the voltage across any transistor rising above the "low voltage" level. As shown, buffer 10 comprises a resistor divider tree 12 formed of a plurality of N-tub resistors $14_1$–$14_7$ disposed between VSS (ground) and VDD5 (the 5 V power supply rail). Resistor divider tree 12 thus generates a plurality of different reference voltages, labeled VL1, VL2, VL3, VH1, VH2 and VH3 in FIG. 1. Resistors $14_1$–$14_7$ are sized such that VL3 is one-third of VDD5 and VH1 is two-thirds of VDD5. The voltages VL1 and VL2 are evenly divided between VSS and VL3, and the voltages VH2 and VH3 are evenly divided between VDD5 and VH1. Transistors 16–34 form a tapered inverter chain 36 whose output voltages are slowly shifted from the 0-VDD (i.e., 0–3 V) range to the VL3–VDD5 (i.e., 3.3–5 V) range. In particular, a first inverter formed by transistors 16 and 18 is biased between VDD and VSS, a second inverter (formed by transistors 20 and 22) is biased between VL1 and VH1, and so on, with the last inverter (formed by transistors 32 and 34) biased between VL3 and VDD5. The output from inverter chain 36, defined as node P in FIG. 1, is applied as the gate voltage to a P-channel transistor 38. By first shifting the voltage potentials associated with the power supplies, the voltage across the gate of transistor 38 will never be the full VDD5 potential, only the difference between VDD5 and VL3 (about 2 V). Transistor 40 acts as a source-follower clamp to keep node B from ever going above VDD-Vtn (where Vtn is defined as the N-channel transistor threshold voltage)—even when a full 5 V is applied to the PAD terminal. Similarly, transistor 42 clamps node C from ever going below VL3+Vtp (Vtp being a P-channel transistor threshold voltage)—even when the PAD terminal is held at zero.

While this circuit works well under normal conditions, it is not "hot-pluggable". "Hot pluggable" circuits must be able to tolerate a voltage on the PAD terminal even when the power supply (VDD5) is not present, without drawing any appreciable current from the device that is coupled to the PAD terminal. In the prior art circuit of FIG. 1, if VDD5 is not present, both VDD and VL3 can be at ground. Therefore, the gate oxides of transistors 40 and 42 will experience a 5 V stress if the PAD voltage reaches this level. Additionally, the parasitic diodes of transistors 38 and 42 (which are normally backgate biased to VDD5 as shown) can be easily turned "on" if VDD5 is not present, thereby drawing a large current from the device driving the voltage to PAD.

One known solution to the above "hot pluggable" problem is to utilize a relatively thick gate oxide for any devices that may be exposed to the relatively high voltages at their gate terminals and utilize a standard gate oxide for all remaining devices. In this case, transistors 38, 40 and 42 would require a thick oxide in order to be protected from PAD high voltages in the absence of VDD5. The use of two different gate oxide thicknesses is a very expensive technique that adds appreciable extra cost and process time to conventional CMOS processing technology.

SUMMARY OF THE INVENTION

The present invention relates to a CMOS high voltage drive output buffer protection circuit and, more particularly, to a CMOS high voltage drive output buffer protection circuit formed in low voltage CMOS technology (i.e. 3.3 V) that is tolerant of high voltage CMOS input voltages (i.e. 5 V) and will not draw any current in the "no power" state (i.e., when VDD5 is not present).

In accordance with the present invention, the drive stage portion of the circuit of FIG. 1 is replaced with a circuit capable of protecting the output transistors from being "stressed" during hot pluggable conditions. Biasing for the circuit of the present invention is provided, in part, by a reference voltage generator for generating a voltage VDD2 that will be equal to VDD as long as VDD is present, and when VDD is not present, VDD2 will track the PAD voltage (remaining a predetermined voltage less than PAD). An inverter, biased between VL3 and VDD2, is used to generate a gate bias voltage to control the operation of the drive stage. Clamping transistors are included to insure that a full 5 V does not appear across any device.

An additional aspect of the present invention is to provide a backgate bias generator circuit that is hot pluggable and is capable of generating a 5 V protection voltage for all P-channel devices within the inventive drive stage.

Other and further aspects of the present invention will become apparent during the course of the following discussion and by reference to the accompanying drawings.

BRIEF DESCRIPTION OF THE DRAWINGS

Referring now to the drawings.

DETAILED DESCRIPTION

Figure 1:
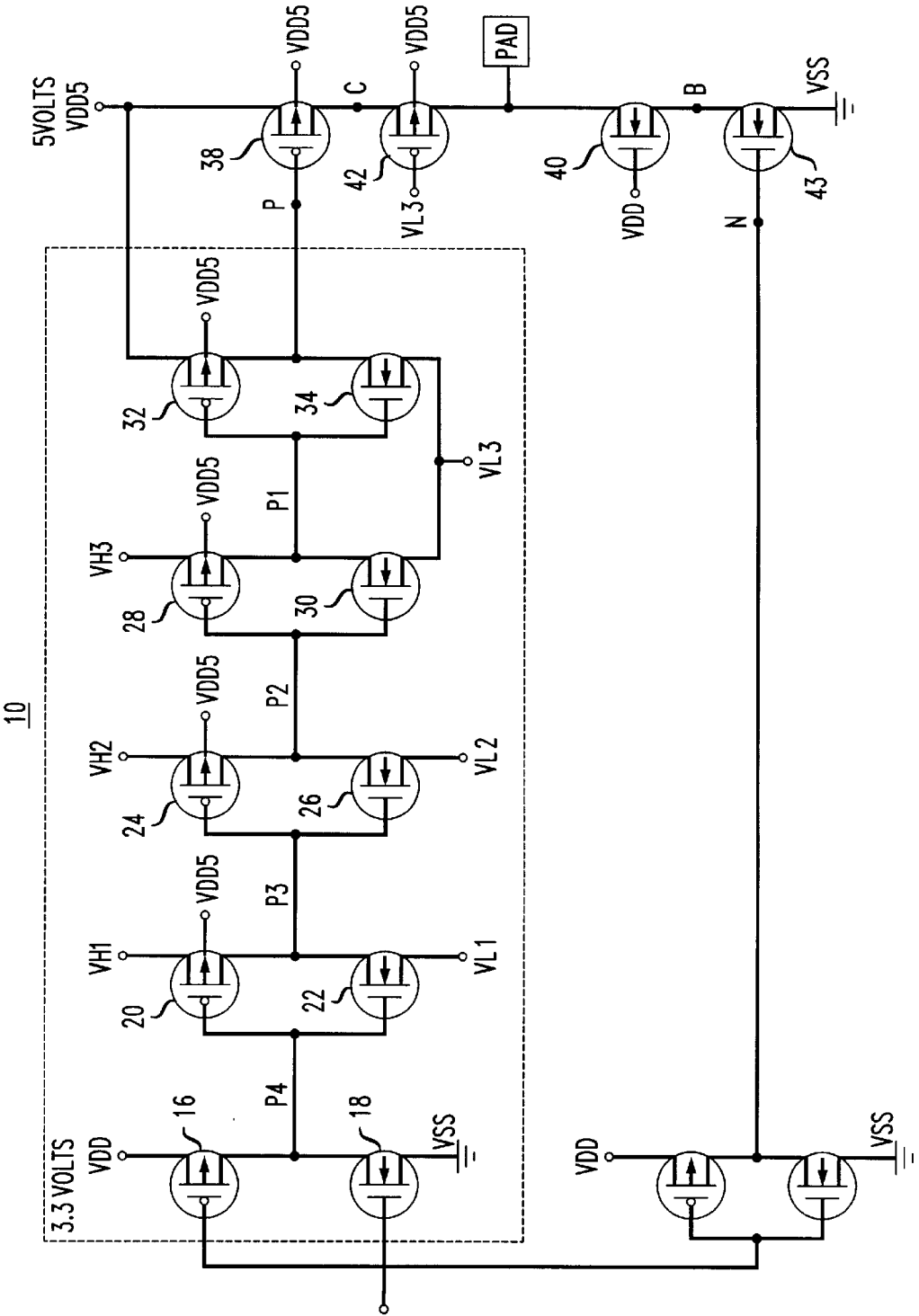
FIG. 1 illustrates a conventional prior art 5 V drive output buffer, as discussed above.
Figure 1:
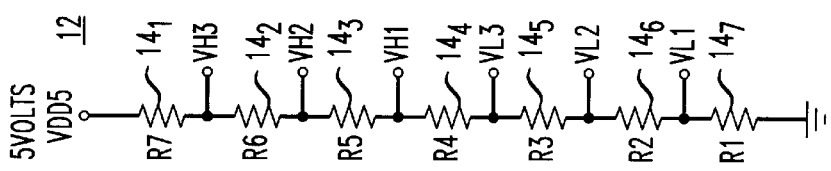
Figure 2:
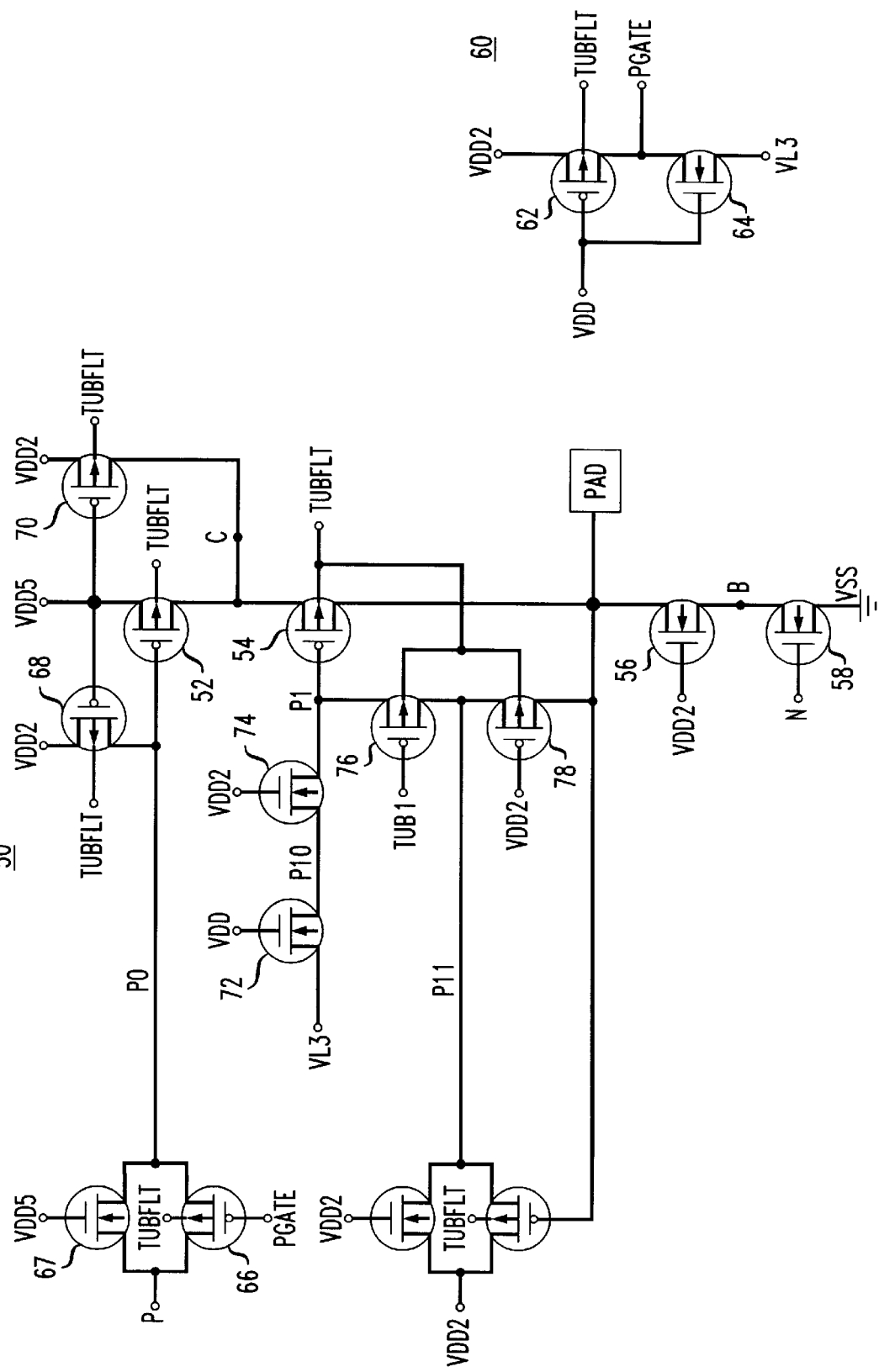
FIG. 2 is a diagram of the drive stage of an exemplary 5 V drive output buffer of the present invention, for use with the resistor tree and inverter chain of the buffer circuit of FIG. 1.
Figure 5:
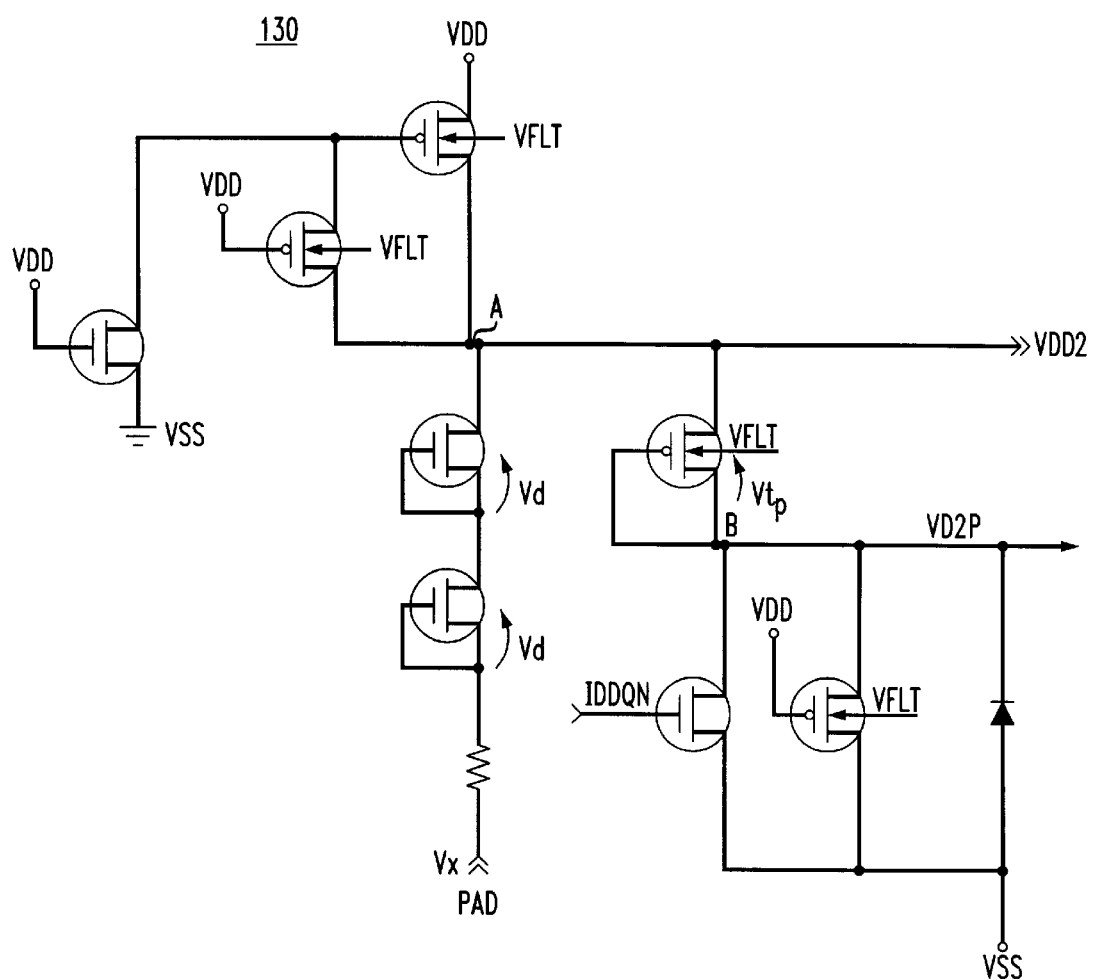
FIG. 5 is a schematic diagram of an exemplary CMOS reference voltage generator useful with the 5 V drive output buffer of the present invention.

An exemplary drive stage 50 for use with the buffer circuit of FIG. 1 is shown in FIG. 2. Drive stage 50 is used to replace transistors 38, 40, 42 and 43 of the prior art buffer circuit of FIG. 1 and results in forming a "hot pluggable" 5 V drive output buffer. Nodes P and N of FIG. 1 are illustrated as the same nodes P and N in FIG. 2 and are used to drive the circuit of the present invention. A reference voltage VDD2 is also applied as an input to drive stage 50. Reference voltage VDD2 is generated to be equal to VDD as along as VDD is present, and when VDD is not present (hot pluggable conditions), VDD2 will be maintained at a predetermined voltage less than the PAD voltage (usually, approximately two diode drops less than PAD). An exemplary circuit for generating reference voltage VDD2 is illustrated in FIG. 5. As shown a CMOS reference voltage generator 130 is configured such that a generated reference voltage VDD2 is essentially equal to the power supply VDD as long as VDD is "present" (typically 3.0–3.6 volts, but in general any voltage above approximately 1 V), regardless of the voltage on the signal bus ("PAD"), which may rise to, for example, 5 V if a mix of CMOS technology is present in the circuit. If VDD is not present—meaning either that VDD=0, or any other condition where the VDD voltage does not register, such as a broken lead or disconnection (all of these situations hereinafter referred to as "hot pluggable" condition), the circuit is configured to maintain VDD2 at a level of at least two diode drops below the voltage appearing at PAD. Therefore, even in the situation where PAD=5.5 V, VDD2 will be approximately 2.8 V and will therefore protect any and all following circuit elements from the PAD high voltage. Summarizing, during normal operation, when VDD=3.3 V and VDD5=5 V, and no external voltage is applied to PAD, VDD2=VDD. Under these circumstances, transistors 52, 54, 56 and 58 function is a manner similar to transistors 38, 42, 40 and 43 (respectively) of the prior art circuit. The similar functionality is provided by using an inverter 60, consisting of a P-channel device 62 and N-channel device 64, coupled between VDD2 and VL3, as shown in FIG. 2. The input to the inverter is the power supply voltage VDD and the output is defined as PGATE. During "normal" operation when VDD is present, therefore, PGATE will be equal to VL3. As shown in FIG. 2, PGATE is applied as an input to a transmission gate formed by a P-channel device 66 and an N-channel device 67. In particular, PGATE is applied as the gate control voltage to P-channel device 66, keeping device 66 "on" such that the signal appearing at input node P can be transferred to output node P0, allowing node P0 to follow input P all the way from VDD5 to VL3. Node P0 is coupled to the gate of P-channel device 52, where device 52 functions in a manner similar to device 38 of the prior art circuit of FIG. 1. Since transistors 68 and 70 will be "off" (as long as VDD5 is present, the gates of transistors 68 and 70 will be held at VDD5 and the transistors will not conduct), the full P voltage will appear at the gate of device 52.

Referring to FIG. 2, a pair of N-channel devices 72 and 74 are coupled in series between voltage level VL3 (as defined above with respect to FIG. 1, VL3=⅓ VDD5) and the gate of P-channel device 54. The gate of N-channel device 72 is held at VDD and the gate of N-channel device 74 is held at VDD2. During "normal" operation VDD2=VDD and both devices will be "on". Therefore, the full voltage level VL3 will appear at the gate of P-channel device 54, defined as node P1 in FIG. 2. Reference voltage TUB1 (discussed below in association with the backgate bias generator circuit of FIG. 4) is defined as equal to VDD5 and is applied as the gate voltage to a P-channel device 76 where the source of device 76 is coupled to node P1. Since device 76 will be "off" as long as VDD5 is present, the voltage appearing at node P1 will be the full VL3 voltage level. Device 54 will thus function to prevent the voltage appearing at node C from dropping below VL3+Vtp (in a manner similar to device 42 of FIG. 1) during "normal" conditions (that is, as long as VDD and VDD5 are present).

The contrast between the four-transistor drive stage of the prior art and drive circuit 50 of the present invention becomes apparent during "hot pluggable" conditions. That is, when VDD and VDD5 are not present. In this case, when no power is present, and a high voltage is applied to the PAD, VDD2 will rise to two diode drops below PAD, as discussed above. Reference voltage TUB1 will be equal to VDD2 (as will be explained below), so that transistors 76 and 78 will turn "on" as soon as PAD is one P-channel threshold (Vtp) above VDD2. By virtue of transistors 76 and 78 turning "on", node P1 will rise to the PAD voltage, turning off transistor 54. With the absence of VDD, N-channel device 72 will turn "off". The lower voltage VDD2 appearing at the gate of N-channel device 74 will allow device 74 to act as a clamp, protecting the gate oxide of device 72. Within inverter 60, output voltage PGATE will rise to VDD2, resulting in turning "off" P-channel device 66. Since VDD5 is not present, N-channel device 67 will also be "off", thereby preventing the voltage at P0 from propagating through the transmission gate to node P. The absence of VDD5 will also turn "on" P-channel devices 68 and 70. In accordance with the present invention, P-channel devices 68 and 70 function to clamp nodes P0 and C at the VDD2 voltage level. This clamp prevents leakage currents from allowing either node to drift too low, which could stress the gates of transistors 52 and 54. Therefore, unlike the prior art circuit, the output transistors will not be stressed, even in the absence of VDD5. Additionally, none of the devices in this circuit have a gate voltage or a source-to-drain voltage greater than VDD, even when VDD5 is not present and the PAD voltage rises to the 5 V level.

As shown in FIG. 2, the P-channel devices may utilize a voltage, defined as TUBFLT, that is applied to the N-tub of each device. It is well-known that by biasing the tub region of these devices, a P-channel device can be used at a voltage above the power supply without turning on its inherent parasitic diode.

Figure 3:
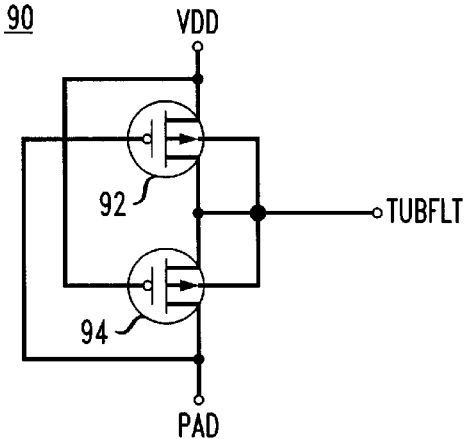
FIG. 3 is a diagram of a conventional prior art backgate bias generator.

FIG. 3 illustrates a conventional prior art arrangement used to generate the TUBFLT voltage. Generator circuit 90 includes a pair of P-channel devices 92 and 94 that are disposed between VDD and PAD voltage potentials. The gate of transistor 92 is coupled to the PAD voltage and the gate of transistor 94 is coupled to VDD. In normal operation, the PAD voltage is between 0 and VDD. In this case, transistor 92 is turned "on" and transistors 94 is "off". Therefore, output voltage TUBFLT will be equal to VDD. When the PAD voltage rises above VDD by one P-channel threshold voltage, transistor 94 will turn "on" and transistor 92 will turn "off". TUBFLT will now be equal to the PAD voltage. Therefore, by applying the TUBFLT voltage to the N-tub backgate of all P-channel devices in a buffer circuit such as that of FIG. 2, the P-channel devices can be used at a voltage above the power supply without turning "on" the parasitic diode in the backgate. However, circuit 90 cannot be used in a low voltage CMOS technology to generate a backgate voltage large enough to bias the N-tubs of transistors that may have a 5 V potential applied to their source or drain, since if the VDD voltage as shown in FIG. 3 were allowed to rise to the 5 V level, then the entire 5 V would be placed on the gate oxide of device 92 whenever PAD was at 0 V.

Figure 4:
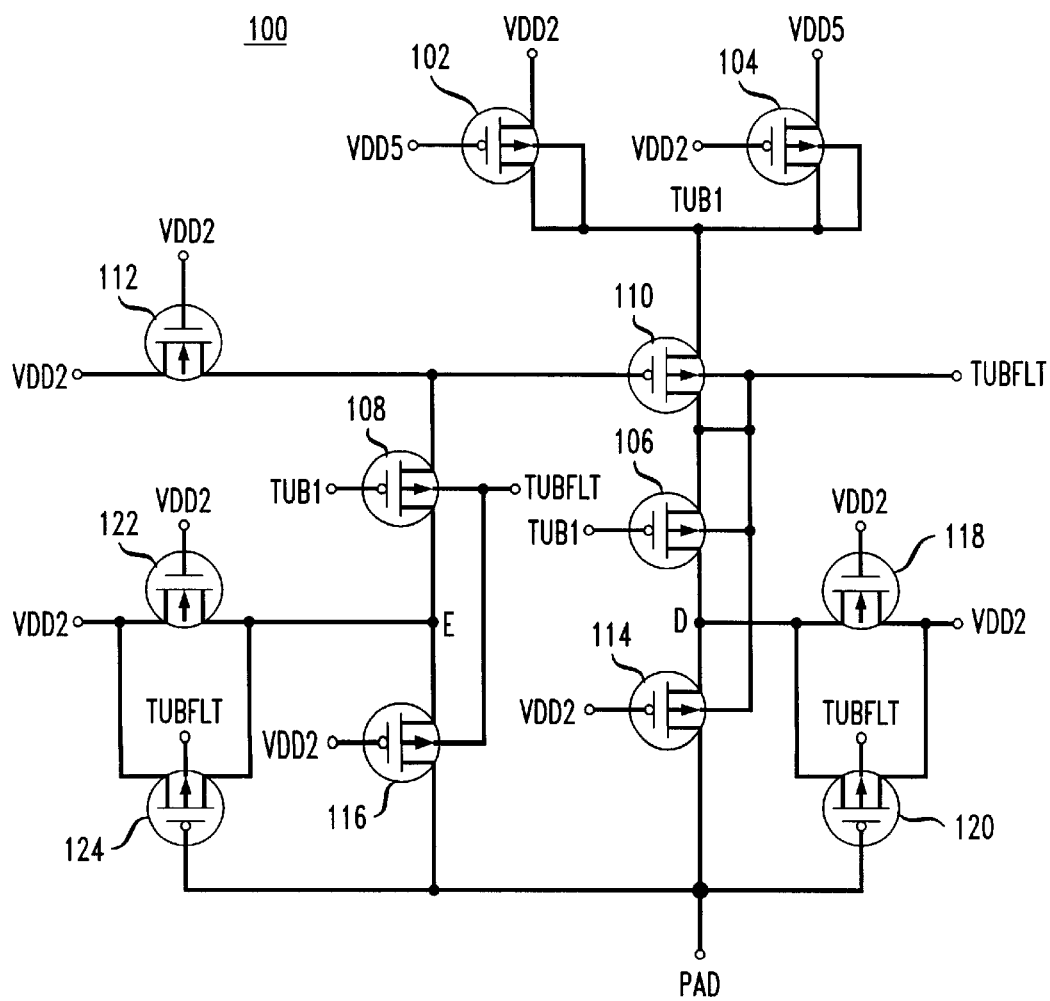
FIG. 4 illustrates an exemplary hot-pluggable, 5 V tolerant backgate bias generator formed in accordance with the present invention for use with the drive stage illustrated in FIG. 2.

FIG. 4 illustrates an exemplary N-tub backgate bias generator 100 of the present invention that is capable of generating an output voltage TUBFLT equal to VDD5 when the PAD voltage is less than VDD5, and an output voltage TUBFLT equal to the PAD voltage when PAD is greater than VDD5. Generator circuit 100 of FIG. 1 is also used to generate the reference voltage TUB1 mentioned above in association with drive circuit 50 of FIG. 2. In accordance with the present invention, the TUBFLT voltage is generated without stressing any transistor with more than 3.6 V. In normal operation, VDD5 is equal to 5 V and VDD2=VDD is 3.3 V. As can be seen by reference to FIG. 5, VDD2 will be equal to VDD as long as VDD is present. When VDD is not present (a "hot pluggable" condition), VDD2 will track the PAD voltage and be maintained a predetermined voltage level (usually two diode drops) below the PAD voltage. Referring back to FIG. 4, a first P-channel device 102 is coupled between generated reference potential VDD2 and TUB1, with the gate of device 101 controlled by VDD5. A second P-channel device 104 is coupled between VDD5 and TUB1, where its gate is controlled by generated reference voltage VDD2. Therefore, as long as VDD5 is equal to 5 V (i.e., "normal" operating conditions), the potential TUB1 will also be equal to 5 V. As shown in FIG. 4, TUB1 is also applied as the gate control voltage to a pair of P-channel devices 106 and 108. As long as TUB1=VDD5, devices 106 and 108 will remain "off". Transistor 110 will be turned "on", since its gate voltage is VDD2-Vtn (where Vtn is defined as the threshold voltage associated with N-channel device 112. With device 110 "on", the output backgate bias voltage TUBFLT will be equal to TUB1 (which, in turn, is equal to VDD5). Transistors 114 and 116 function as clamps, so that when PAD is at ground potential, nodes D and E cannot fall below VDD2+Vtp. This clamping action protects the gate oxides of transistors 106 and 108. When the PAD is at ground potential, transistors 114 and 116 are "off". In this case, transistors 118, 120 set node D equal to VDD2 and, likewise, transistors 122, 124 set node E equal to VDD2. Otherwise, leakage currents might let these nodes drift too low, putting excess voltage across the drain-to-source of transistors 114 and 116, as well as across the oxides of transistors 106 and 108.

In the case where the power supply VDD5 is not present ("hot pluggable" conditions), reference voltage VDD2, as discussed above, will be equal to the PAD voltage less a predetermined voltage level (usually two diode drops, 2 Vd). In this case, P-channel device 102 will turn "on", device 104 turns "off", and reference potential TUB1 will be set to VDD2. When the PAD voltage goes high under this condition, P-channel devices 108 and 116 will turn "on", allowing the full PAD voltage to appear at the gate of device 110, turning device 110 "off". Transistors 106 and 114 are also "on", forming a direct path between PAD and the TUBFLT output. Therefore, during "hot pluggable" conditions, TUBFLT=PAD.

What is claimed is:

1. An integrated circuit including a CMOS high voltage drive output buffer comprising a resistor divider tree disposed between ground (VSS) and a high voltage reference potential (VDD5) for generating a plurality of intermediate reference voltage potentials VL1, VL2, VL3, VH1, VH2, VH3, where VL3 is defined as one-third of the value of the high voltage reference potential; and a tapered inverter chain network for receiving an input signal and comprising a series of inverter stages, each stage biased by a pair of reference voltage potentials generated by the resistor divider tree (VL1 and VH1, VL2 and VH2, VL3 and VH3), for generating a pair of outputs P and N related to the input signal;

CHARACTERIZED IN THAT the high voltage drive output buffer further comprises a drive circuit comprising a first P-channel device and a transmission gate, the input of the transmission gate coupled to output signal P from the tapered inverter chain and the output of the transmission gate coupled to the gate of the first P-channel device;

a second, clamping, P-channel device and a pair of N-channel devices, the pair of N-channel devices coupled in series between the gate of the second P-channel device and the VL3 intermediate reference voltage, the source of the second P-channel device coupled to the drain of the first P-channel device, defining the connection as node C, and the drain of the second P-channel device coupled to a PAD voltage potential, the gate of the first N-channel device controlled by a reference voltage VDD, where VDD<VDD5 and the gate of the second N-channel device controlled by a generated voltage VDD2, where VDD2 is defined as a predetermined voltage drop below PAD when VDD is not present and VDD2=VDD when VDD is present;

a third P-channel device and a fourth P-channel device coupled in series between the gate of the second P-channel device and the PAD voltage potential, the gate of the third P-channel device coupled to a reference voltage TUB1, where TUB1=VDD5 when VDD5 is present and TUB1=VDD2 when VDD5 is not present, and the gate of the fourth P-channel device coupled to generated voltage VDD2, the third and fourth P-channel devices for turning "off" the second P-channel device when VDD5 is not present; and a fifth P-channel device and a sixth P-channel device, the gates of the fifth and sixth devices controlled by VDD5 and the sources of the fifth and sixth devices coupled to the generated voltage VDD2, the drain of the fifth device coupled to the gate of the first P-channel device and the drain of the sixth device coupled to node C, the fifth and sixth devices for turning "on" in the absence of VDD5 and clamping the gate of the first P-channel device and node C to generated voltage VDD2 in the absence of VDD5.

2. An integrated circuit including a CMOS high voltage drive output buffer as defined in claim 1, wherein the transmission gate comprises a P-channel device and an N-channel device, the gate of the P-channel device coupled to the inverse of the VDD voltage potential and the gate of the N-channel device controlled by the high voltage potential VDD5, the sources of the P-channel and N-channel devices coupled together to receive the P input and the drains coupled together to form the transmission gate output applied to the gate of the drive circuit first P-channel device.

3. An integrated circuit including a CMOS high voltage drive output buffer as defined in claim 2 wherein the inverse voltage applied to the gate of the transmission gate P-channel device is formed by a CMOS inverter, the inverter comprising a P-channel device coupled at its source to the generated potential VDD2, the gate of the inverter P-channel device controlled by VDD; and an N-channel device coupled at its gate to the inverter P-channel gate and its source coupled to the VL3 intermediate voltage, the drain of the N-channel device coupled to the drain of the P-channel device and forming the output voltage applied as an input to the transmission gate P-channel device gate.

4. An integrated circuit including a CMOS high voltage drive output buffer as defined in claim 1 wherein reference voltage TUB1 is generated by a circuit comprising a first P-channel device coupled at its source to generated voltage VDD2 and at its gate to high voltage reference potential VDD5;

a second P-channel device coupled at its source to high voltage reference potential VDD5 and at its gate to generated voltage VDD2, the drains of the first and second devices coupled together and defined as the TUB1 reference potential such that TUB1 is equal to high voltage reference potential VDD5 when VDD5 is present and TUB1 is equal to generated reference voltage VDD2 when VDD5 is not present.

5. An integrated circuit including a CMOS high voltage drive output buffer as defined in claim 4 wherein the high voltage drive output buffer further comprises a backgate bias generator for applying a generated voltage TUBFLT to an N-tub region of each P-channel device, the backgate bias generator comprising a first N-channel device having its gate and source coupled to generated reference voltage VDD2;

a first P-channel device coupled at its source to the TUB1 generated voltage, the gate of the first P-channel device coupled to the drain of said first N-channel device and the drain of the first P-channel device defined as the TUBFLT output;

a second P-channel device coupled at its source to the gate of the first P-channel device, the gate of the second P-channel device controlled by the TUB1 generated voltage, the second P-channel device remaining "off" as long as VDD5 is present;

a third P-channel device coupled at its source to the drain of the first P-channel device and the gate of the third P-channel device controlled by generated voltage TUB1 such that the first P-channel device will be "on", allowing the generated voltage TUB1 to appear as the output TUBFLT;

a fourth P-channel device coupled at its source to the drain of the third P-channel device, the drain of the fourth P-channel device coupled to the PAD reference potential and the gate of said fourth P-channel device controlled by generated reference potential VDD2, said fourth P-channel device for clamping the voltage present at the drain of said third P-channel device when the PAD reference voltage is equal to zero; and a fifth P-channel device coupled at its source to the drain of the second P-channel device, the drain of the fifth P-channel device coupled to said PAD reference potential and the gate of said fifth P-channel device controlled by generated reference potential VDD2, said fifth P-channel device for clamping the voltage present at the drain of said second P-channel device when said PAD reference voltage is equal to zero.

6. An integrated circuit including a CMOS high voltage drive output buffer as defined in claim 5 wherein the backgate bias generator further comprises a second N-channel device, coupled between the drain of the third P-channel device and generated reference potential VDD2, the gate of said second N-channel device also controlled by generated reference potential VDD2;

a sixth P-channel device, coupled across the drain and source of said second N-channel device, the gate of said sixth P-channel device controlled by the PAD reference voltage, wherein the combination of said second N-channel device and said sixth P-channel device will maintain the drain of said third P-channel device at the generated voltage VDD2 as long as the high voltage reference potential VDD5 is present; and a third N-channel device, coupled between the drain of the second P-channel device and generated reference potential VDD2, the gate of said third N-channel device also controlled by generated reference potential VDD2; and a seventh P-channel device, coupled across the drain and source of said third N-channel device, the gate of said seventh P-channel device controlled by said PAD reference voltage, wherein the combination of said third N-channel device and said seventh P-channel device will maintain the drain of said second P-channel device at the generated voltage VDD2 as long as said high voltage reference potential VDD5 is present.

* * * * *